United States Patent [19]
Ohki

[11] Patent Number: 5,652,855
[45] Date of Patent: Jul. 29, 1997

[54] MEMORY CIRCUIT, METHOD OF ACCESS, AND METHOD OF PREPARATION OF DATA IN MEMORY

[75] Inventor: Mitsuharu Ohki, Tokyo, Japan

[73] Assignee: Sony Corporation, Tokyo, Japan

[21] Appl. No.: 412,949

[22] Filed: Mar. 29, 1995

[30] Foreign Application Priority Data

Mar. 31, 1994 [JP] Japan .................................. 6-063808

[51] Int. Cl.⁶ .................................................. G06F 13/00
[52] U.S. Cl. ..................... 395/429; 395/420; 395/427; 395/410; 364/DIG. 1
[58] Field of Search ........................... 395/420, 427, 395/429; 365/230.06

[56] References Cited

U.S. PATENT DOCUMENTS

| | | | |
|---|---|---|---|
| 5,175,808 | 12/1992 | Sayre | 395/133 |
| 5,390,311 | 2/1995 | Fu et al. | 395/400 |
| 5,528,176 | 6/1996 | Kean | 326/105 |

*Primary Examiner*—Frank J. Asta
*Attorney, Agent, or Firm*—Jay H. Maioli

[57] ABSTRACT

A memory circuit, method of access, and method of preparation of data, which enable construction of a redundancy-free memory and hardware of a smaller circuit size, wherein of the data (C2, C6, −C2, −C2, −C6, C6, and C2) of a redundancy-ridden read only memory in which the same first data is stored a plurality of addresses, the same data existing at a plurality of addresses are assigned to a single address of the read only memory so as to prepare and record at predetermined addresses the data (C2, C6, −C6, and −C2) of the read only memory, provision is made of an address conversion circuit comprised of a decoder, two-input OR circuits for transforming the single address data of the read only memory to accessible addresses without requiring advance change of the address designations when there are address designations, and the single address of the memory is accessed and data output in accordance with the address designation.

7 Claims, 7 Drawing Sheets

MEMORY CIRCUIT, METHOD OF ACCESS, AND METHOD OF PREPARATION OF DATA IN MEMORY

BACKGROUND OF THE INVENTION

1. Field of the Invention

The present invention relates to a memory circuit, a method of access, and a method of preparation of data in the design of a circuit using a read only memory (ROM) or other memory Which enable a memory with redundancy of data (hereinafter referred to as a "redundancy-ridden memory" or "redundant memory") to be transformed to a memory without redundancy of data (hereinafter referred to as a "redundancy-free memory") and the size of the circuit to thereby be reduced.

2. Description of the Related Art

One example of a circuit using a read only memory is a discrete cosine transformation (DCT) circuit. An explanation will first be made of this.

Discrete cosine transformation is a method of transformation used in the field of image compression etc. More specifically, 8th order discrete cosine transformation involves calculation of the following equations:

$$F0 = C4 \times D0 + C4 \times D1 + C4 \times D2 + C4 \times D3 + C4 \times D4 + C4 \times D5 + C4 \times D6 + C4 \times D7$$
$$F1 = C1 \times D0 + C3 \times D1 + C5 \times D2 + C7 \times D3 - C7 \times D4 - C5 \times D5 - C3 \times D6 - C1 \times D7$$
$$F2 = C2 \times D0 + C6 \times D1 - C6 \times D2 - C2 \times D3 - C2 \times D4 - C6 \times D5 + C6 \times D6 + C2 \times D7$$
$$F3 = C3 \times D0 - C7 \times D1 - C1 \times D2 - C5 \times D3 + C5 \times D4 + C1 \times D5 + C7 \times D6 - C3 \times D7$$
$$F4 = C4 \times D0 - C4 \times D1 - C4 \times D2 + C4 \times D3 + C4 \times D4 - C4 \times D5 - C4 \times D6 + C4 \times D7$$
$$F5 = C5 \times D0 - C1 \times D1 + C7 \times D2 + C3 \times D3 - C3 \times D4 - C7 \times D5 + C1 \times D6 - C5 \times D7$$
$$F6 = C6 \times D0 - C2 \times D1 + C2 \times D2 - C6 \times D3 - C6 \times D4 + C2 \times D5 - C2 \times D6 + C6 \times D7$$
$$F7 = C7 \times D0 - C5 \times D1 + C3 \times D2 - C1 \times D3 + C1 \times D4 - C3 \times D5 + C5 \times D6 - C7 \times D7$$

Here, D0 to D7 show input data and F0 to F7 show output data. Further, C1 to C7 are constants (coefficient data) and $Ci = \cos(i \times \pi/16)$.

FIG. 1 shows an example of the configuration of an inner product calculation circuit which receives as input the data D0 to D7 and calculates and outputs the data F2. In FIG. 1, reference numeral 1 represents a control circuit (CTL), 2 represents a read only memory (ROM), 3 represents a multiplication and addition (product-sum) calculator, WA0, WA1, and WA2 represent address signal lines, WD represents an input signal line, WCOE represents a coefficient signal line, and WF represents an output signal line. Note that in FIG. 1, WD, WCOE, and WF represent bus lines, while WA0, WA1, and WA2 represent one-bit lines.

In this circuit, the data D0 to D7 applied to from the input terminal IN are input through the input signal line WD to the multiplication and addition calculator 3.

Further, addresses (4×WA2+2×WA1+WA0) are applied to the read only memory 2 from the control circuit 1 through the address signal lines WA0, WA1, and WA2.

The read only memory 2 is for example an eight-word read only memory. As shown in FIG. 3, the coefficient data Ci and −Ci (where, i=2, 6) are stored at the 0-th to 7-th addresses.

The data stored corresponding to the addresses given from the control circuit 1 are output from the read only memory 2 to the coefficient signal line WCOE. The coefficient data output to the coefficient signal line WCOE are input to the multiplication and addition calculator 3.

In the multiplication and addition calculator 3, the inner product between the input data and the coefficient data are calculated. The result of the calculation, that is, the data F2, is output through the output signal line WF to the output terminal OUT.

FIGS. 2A to 2D are timing charts of the circuit of FIG. 1. The operation of the circuit of FIG. 1 will be explained in more detail based on these timing charts.

The data D0, D1, D2, ..., D7 are successively input from the input terminal IN as shown in FIG. 2A.

The address signals (4×WA2+2×WA1+WA0) from the control circuit 1 are, as shown in FIG. 2B, "0", "1", "2", ..., "7". Due to these address signals, the read only memory 2 outputs, as shown in FIG. 2C, the coefficient data "C2", "C6", "−C2", "−C2", "−C6", "C6", and "C2".

In the multiplication and addition calculator 3, the data D0 (FIG. 2A) and the coefficient C2 (FIG. 2C) are multiplied at the first cycle, the data D1 (FIG. 2A) and the coefficient C6 (FIG. 2C) are multiplied at the second cycle, and the data of FIG. 2A and the data of FIG. 2C are multiplied in the following third to eighth cycles as well.

In the multiplication and addition calculator 3, further, the results of the first to eighth cycle multiplication operations are cumulatively added as well.

At the end of the eighth cycle, in the multiplication and addition calculator 3, F2=C2×D0+C6×D1−C6×D2−C2×D3−C2×D4−C6×D5+C6×D6+C2×D7 is calculated and the data F2 is output from the output terminal OUT as shown in FIG. 2D.

As will be understood from the above explanation, the control circuit 1 of FIG. 1 is comprised of a counter which counts from "0" to "7".

Further, the data to be stored at the i (i=0 to 7)-th address of the read only memory 2 of FIG. 3 is the value of data to be multiplied with the input data Di. Accordingly, it is simple to design a circuit of FIG. 1 (data of ROM Shown in FIG. 3) as the circuit for calculating the value F2.

However, such an easy-to-design circuit has redundancy of data and therefore ends up large in size. That is, the read only memory of FIG. 1 is a redundancy-ridden read only memory.

In the past, there has never been a method of transforming such an easy-to-design redundancy-ridden read only memory (for example, the ROM of FIG. 1) to a redundancy-free read only memory, so hardware had to be made based on a circuit designed with redundancy and it was only possible to fabricate a circuit large in size.

The flow of the design process is shown in FIG. 4. A step a of FIG. 4, a circuit including a redundancy-ridden memory circuit is designed. As shown in step b of FIG. 4, hardware is then made based on the circuit including the redundancy-ridden memory circuit as designed.

The hardware actually constructed by the conventional design process shown in FIG. 4 therefore suffered from the disadvantage of a large circuit size.

SUMMARY OF THE INVENTION

The present invention was made in consideration of this situation and has as its object to provide a memory circuit, a method of access for the same, and method of preparation of data which enable design of a redundancy-free memory of a few words and realization of hardware of a small circuit size.

To accomplish the above object of the present invention, according to the present invention, there is provided a memory circuit comprising a memory which records in advance at a common single address the same data among data to be read out by accessing of a plurality of addresses, and an address conversion circuit for transforming address designations of the above plurality of addresses to an address able to access the data of the above single address without requiring advance change of the address designations.

Further, according to the present invention, there is provided a method of accessing a memory circuit including a first step of recording at a common single address the same data of a plurality of addresses, and a second step of transforming address designations of the above plurality of addresses to an address able to access the data of the above single address without requiring advance change of the address designations.

Still, further, according the present invention, there is provided a method of preparation of data of a memory comprising receiving as input the data of a first memory in which the same first data are stored at a plurality of addresses, assigning to a single address of a second memory the above first data existing at a plurality of addresses among the data of the first memory so as to prepare data of the second memory, and outputting data of the second memory.

According to the memory circuit of the present invention, the same data out of the data to be read out by accessing a plurality of addressee are recorded in advance at a common single address of the memory.

Further, the address designations of such a plurality of addresses are transformed to an address able to access the above data of the single address without requiring advance change of the address designations. By this, predetermined data is output from the memory.

According to the method of preparation of data for a memory of the present invention, when for example eight bits of data "C2", "C6", "–C6", "–C2", "–C2", "–C6", "C6", and "C2" are stored at a plurality of addresses of a first memory, a single address of a second memory is assigned for the same data among these data of the first memory present at different addresses. As a result of this, the data of the second memory become the four bits of data "C2", "C6", "–C6", and "–C2".

BRIEF DESCRIPTION OF THE DRAWINGS

The above and other objects and features of the present invention will be more apparent from the following description of the preferred embodiments with reference to the accompanying drawings, wherein.

DETAILED EXPLANATION OF PREFERRED EMBODIMENTS

Figure 5:
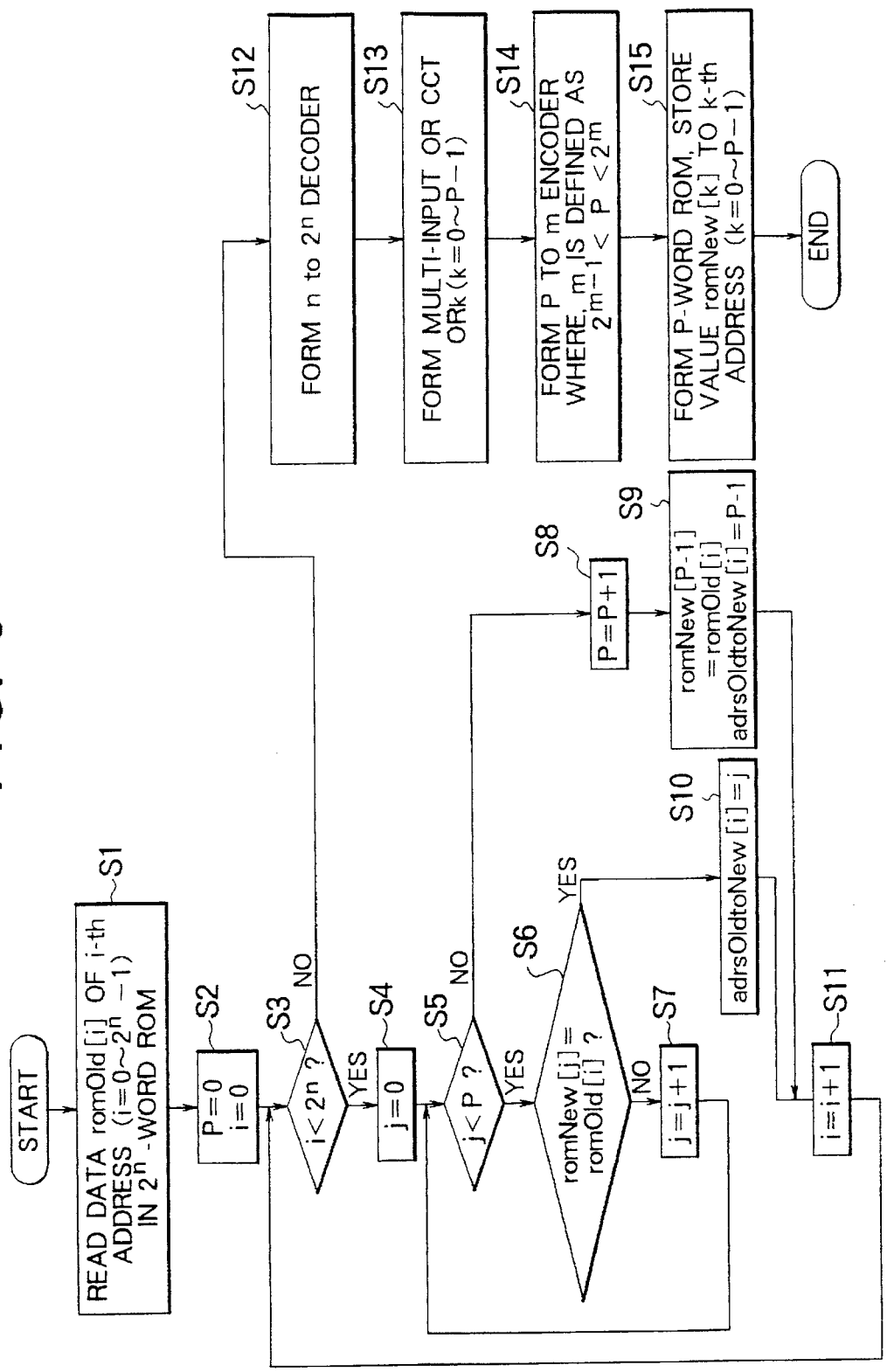
FIG. 5 is a flowchart for explaining the method of preparation of data of the read only memory according to the present invention and the method of construction of a memory circuit.

FIG. 5 is a flowchart for explaining the method of preparation of data of a read only memory according to the present invention and the method of constructing a memory circuit. The methods are as follows:

First, at step S1, the values of the redundancy-ridden $2^n$ word read only memory receiving as input the address signals WA0 to WAn−1 and outputting the signal WCOE are read and are defined as romOld[i].

Next, at step S2, P is defined as 0 and i is defined as 0. Here, P is the number of the romNEW[j] to be registered, explained later.

Next, at step S3, it is determined if i is less than $2^n$. If an affirmative decision is obtained, the routine proceeds to the processing of step S4, while if a negative decision is obtained, the routine proceeds to the processing of step S12. At step S4, j is set as 0.

Next at step S5, it is determined if j is lees than P. If an affirmative decision is obtained, the routine proceeds to the processing of step S6, while if a negative decision is obtained, the routine proceeds to the processing of step S8.

At step S6, it is determined if romNEW[j] is equal to romOld[i]. If an affirmative decision is obtained, the routine proceeds to the processing of step S10, while if a negative decision is obtained, the routine proceeds to the processing of step S7.

When the routine proceeds to the processing of step S7, j is incremented by 1 and the processing of step S5 is returned to.

When as a result of the decision at step S5 the processing of step S8 is proceeded to, P is incremented by 1. Further, at step S9, romOld[i] is substituted for romNew[P−1] and (P−1) is substituted for adrsOldtoNew[i] and the processing of step S11 is proceeded to.

When as a result of the decision at step S6 the processing of step S10 is proceeded to, j is substituted for romOldtoNew[i] and the processing of step S11 is proceeded to.

At step S11, i is incremented by 1 and the processing of step S3 is returned to.

When as a result of the decision at step S3 the processing of step S12 is proceeded to an n-to-$2^n$ decoder receiving as input the WA0 to WAn−1 and outputting WDEC0 to WDEC ($2^n$−1) is constituted.

Next at step 13, a multiple-input OR circuit ORk (k=0 to P−1) receiving as input all of the WDECh where the adrsOldtoNew[h]=k and outputting WORk is constituted.

Next, at step S14, a P-to-m encoder receiving as input WOR0 to WORP−1 and outputting WENC0 to WENCm−1 is constituted. Here, m is a value satisfying the relationship of $2^{m-1} < m \leq 2^m$.

Further, at step S15, a P-word read only memory receiving as input the address signals WENC0 to WENCm−1 and outputting WCOE is constituted. Here, the value of romNew [k] is stored at k (k=0 to P−1).

The data is prepared and the circuits of the memory circuit are constituted in the above manner.

By using the above methods for circuit design, it possible to transform a redundancy-ridden read only memory to a redundancy-free read only memory and to construct a memory circuit able to access data without requiring advance change of address designations. This will be explained in further detail below with reference to a more specific example.

Figure 3:
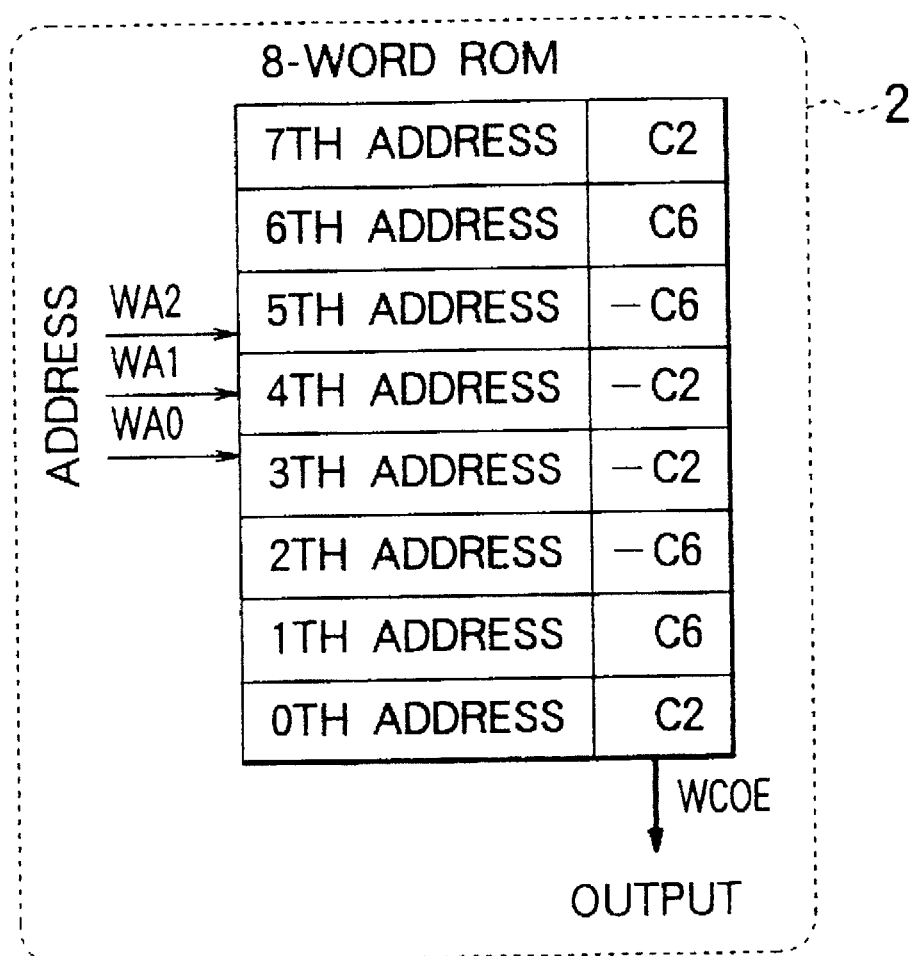
FIG. 3 is a view showing data stored in a redundancy-ridden read only memory used for the circuit of FIG. 1.

More specifically, an explanation will be made, referring to FIG. 5 and FIGS. 6A and 6B, of the case of transforming the redundancy-ridden read only memory (FIG. 3) used in a circuit for calculating the data F2 shown in FIG. 1, explained as a related art, into a redundancy-free read only memory and of constructing a memory circuit able to access data without requiring advance change of the address designations.

Figure 6A:
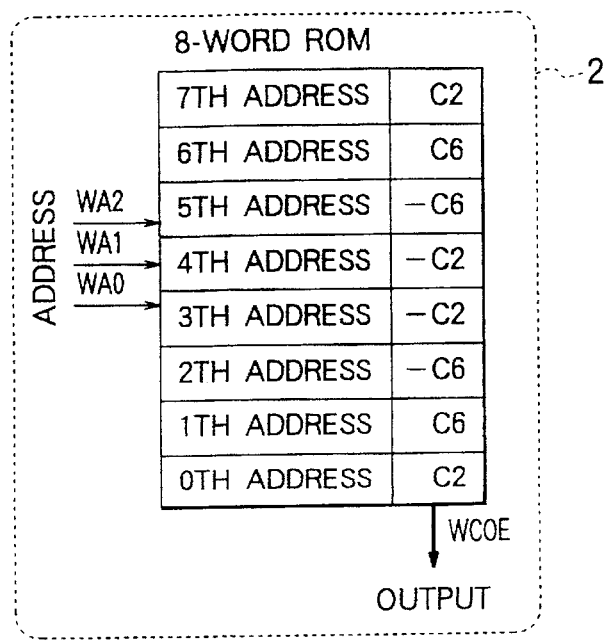
FIGS. 6A and 6B are views for explaining a specific example of the use of the present invention.

First, as shown by step S1 in FIG. 5 and FIG. 6A, the values "C2", "C6", "–C6", "–C2", "–C2", "–C6", "C6", and "C2" of the redundancy-ridden read only memory 2 are read from the address 0 to the address 7. Table 1 shows the results of read.

TABLE 1

| romOld[0] = C2 |
| --- |
| romOld[1] = C6 |
| romOld[2] = –C6 |
| romOld[3] = –C2 |
| romOld[4] = –C2 |
| romOld[5] = –C6 |
| romOld[6] = C6 |
| romOld[7] = C2 |
| Here, n = 3. |

Next, the processing of steps S2 to S11 in FIG. 5 are performed to prepare the data romNew[j] of the new redundancy-free read only memory. At this time, the same values out of the values romOld[0] to romOld[7] of the redundant read only memory 2 are consolidated into one.

That is, at step S6 of FIG. 5, when a romOld[j] has already be recorded as romNew[j], step S10 is passed through to proceed to the processing of step S11 and there is no recordal of romNew[j] at step S9.

Next, when an affirmative decision is obtained at step S3 in FIG. 5 and the processing of step 12 is proceeded to the results shown in Tables 2 and 3.

TABLE 2

| romNew[0] = C2 |
| --- |
| romNew[1] = C6 |
| romNew[3] = –C2 |
| P = 4. |

Here, P is the number of the recorded romNew[j] and becomes the number of words of the new redundancy-free read only memory.

TABLE 3

| adrsOldtoNew[0] = 0 |
| --- |
| adrsOldtoNew[1] = 1 |
| adrsOldtoNew[2] = 2 |
| adrsOldtoNew[3] = 3 |
| adrsOldtoNew[4] = 3 |
| adrsOldtoNew[5] = 2 |
| adrsOldtoNew[6] = 1 |
| adrsOldtoNew[7] = 0 |

This shows that She data which had been stored at the i-th address of the redundancy-ridden read only memory 2 is re-stored at the new redundancy-free read only memory adrsOldto New[i]-th address.

Figure 6B:
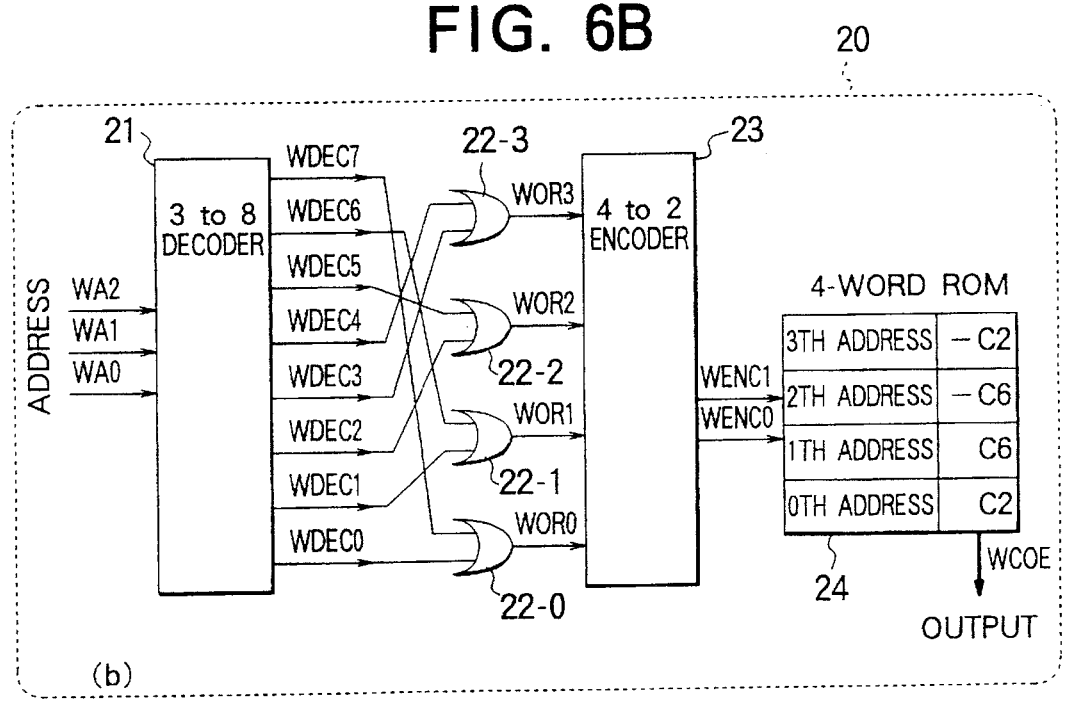

Next, at steps S12 to S15 in FIG. 5, as shown in FIG. 6B, an address conversion circuit comprised of the 3-to-8 decoder 21, the four two-input OR circuits 22-0 to 22-3, and the 4-to-2 encoder 23 and a memory circuit 20 comprised of the redundancy-free four-word read only memory 24 are constituted. In this case, the m at step S14 is 2.

In this way, by applying the present invention for the redundancy-ridden read only memory 2 shown in FIG. 6A, a memory circuit 20 provided with a redundancy-free read only memory 24 and an address conversion circuit comprised of the 3-to-8 decoder 21, the four two-input OR circuits 22-0 to 22-3, and the 4-to-2 encoder 23 are constituted.

In FIG. 6A, when for example "1" (WA2=1, WA1=0, WA0=1) or "6" (WA2=1, WA1=1, WA0=0) is input as the address, the value of "C6" is output to the coefficient signal line WCOE.

In the memory circuit 20 of FIG. 6B, the address designations are not changed. When "1" (WA2=1, WA1=0, WA0=1) or "6" (WA2=1, WA1=1, WA0=0) is input as an address, just the WDEC1 or WDEC6 is turned on by the 3 to 8 decoder.

Accordingly, just the WOR1 is turned on by the OR circuit 22-1. Further, due to the 4-to-2 encoder WEC1=0 and WENC0=1, the 1st address of the four-word read only memory 24 is designated, and the value of "C6" is output to the coefficient signal line WCOE.

From this, it is learned that the circuit of FIG. 6B is completely equivalent to the redundancy-ridden eight-word read only memory of FIG. 6A.

In FIG. 6A, the read only memory has a size of eight words, while in FIG. 6B, while there was the addition of the extra circuits of the 3-to-8 decoder 21, four two-input OR circuits 22-0 to 22-3 and the 4-to-2 encoder 23, the read only memory 24 need only be four words in size, so the overall circuit becomes smaller in size.

Figure 1:
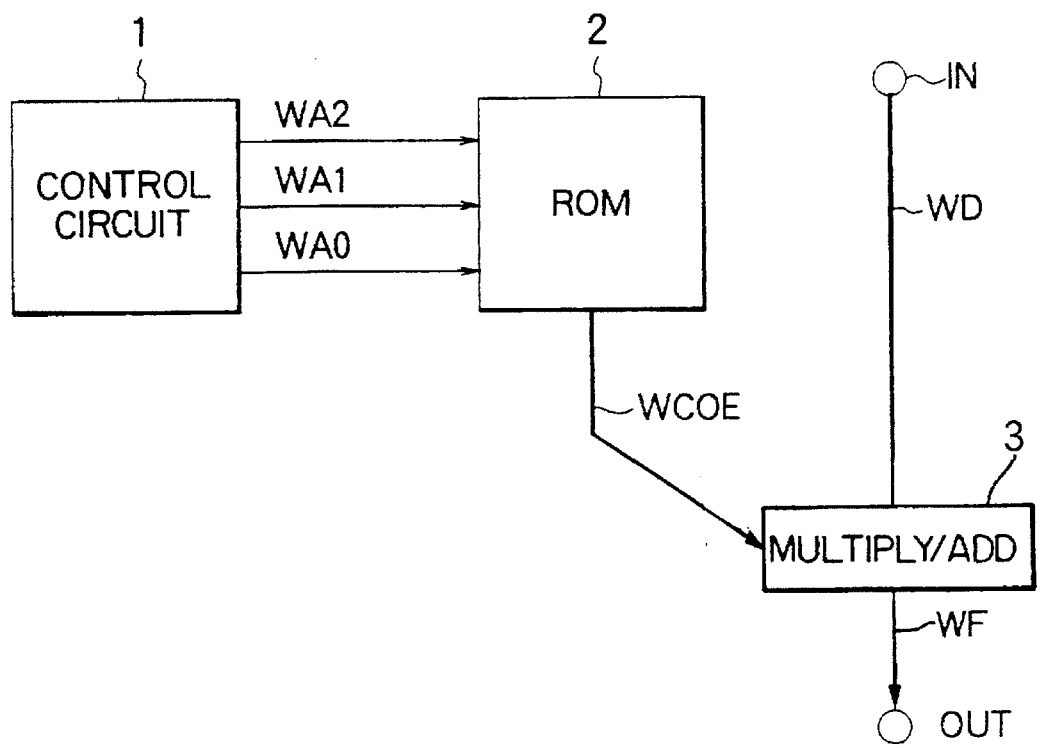
FIG. 1 is a block diagram of an example of a general inner product calculation circuit.
Figure 2:
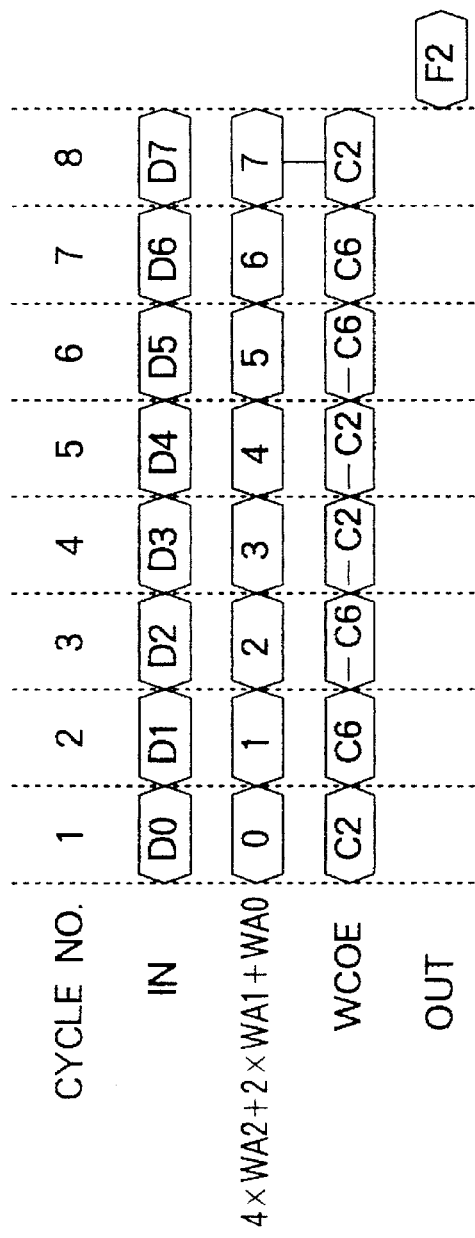
FIGS. 2A and 2B are views explaining the operation of the circuit of FIG. 1.

As a result, by replacing the read only memory (ROM) 2 in FIG. 6A with the memory circuit 20 of FIG. 6B, the size of the circuit of FIG. 1 can be made smaller.

Further, by considering the control circuit 1 and the added portions of the 3-to-8 decoder 21, the four two-input OR circuits 22-0 to 22-3, and the 4-to-2 encoder 23 as a single logical circuit and compressing the logic, the circuit can be made even smaller in size.

Accordingly, it is effective to apply the present invention to a 16×16, 64×64, or other DCT circuit.

Note that "compressing the logic" means conversion replacing the logic circuits with logic circuits completely equivalent and good in performance as the logic circuits. For example, as "compressing the logic", there is known the conversion software called "Design Compiler" of Synopsys Inc.

As explained above, according to the present embodiment, the same values in a redundant read only memory are made values of a new single address to enable construction of a redundancy-free read only memory a smaller number of words in size.

Figure 7:
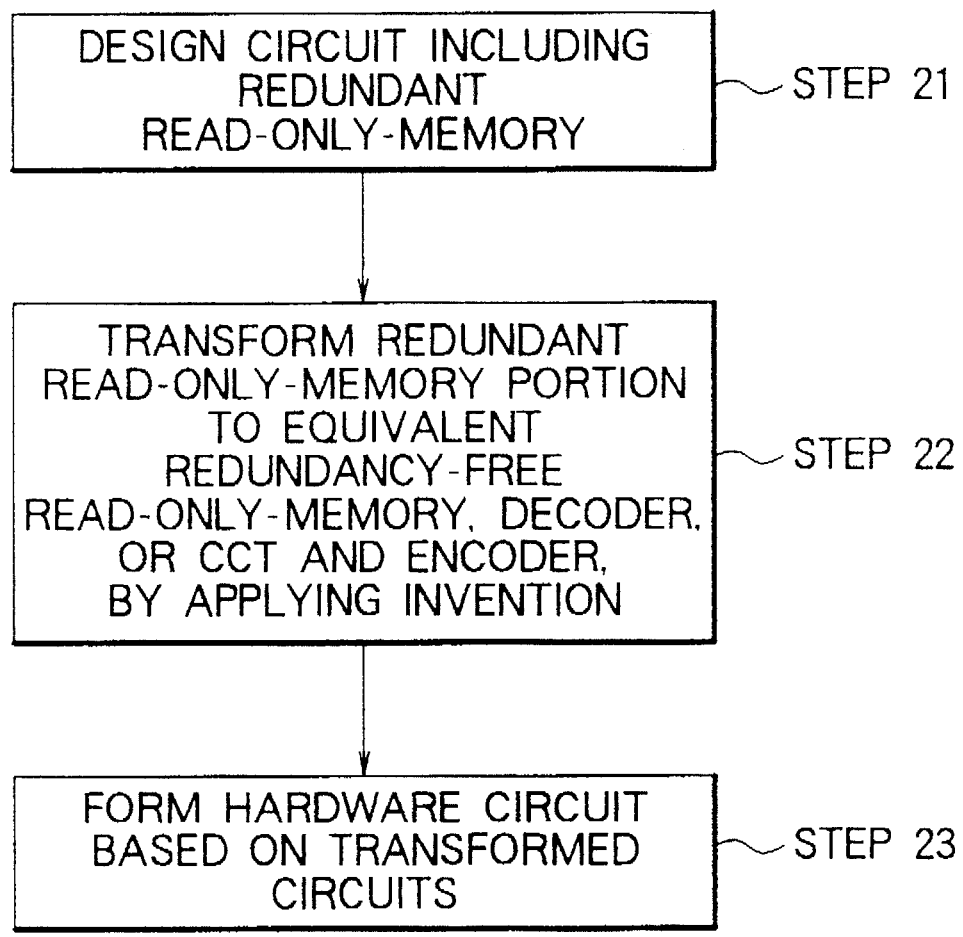
FIG. 7 is a view for explaining the flow of design in the case of use of the present invention.

FIG. 7 shows the flow of design using the method of the present invention.

In circuit design using the method of the present invention, first a circuit including a redundancy-ridden read only memory is designed as shown at step 21, then the redundancy-ridden read only memory portions are transformed into an equivalent redundancy-free read only memory and a decoder, OR circuits, and encoder by application of the present invention as shown at step 22, then hardware is constructed based on the transformed circuit as shown at step 23.

Figure 4:
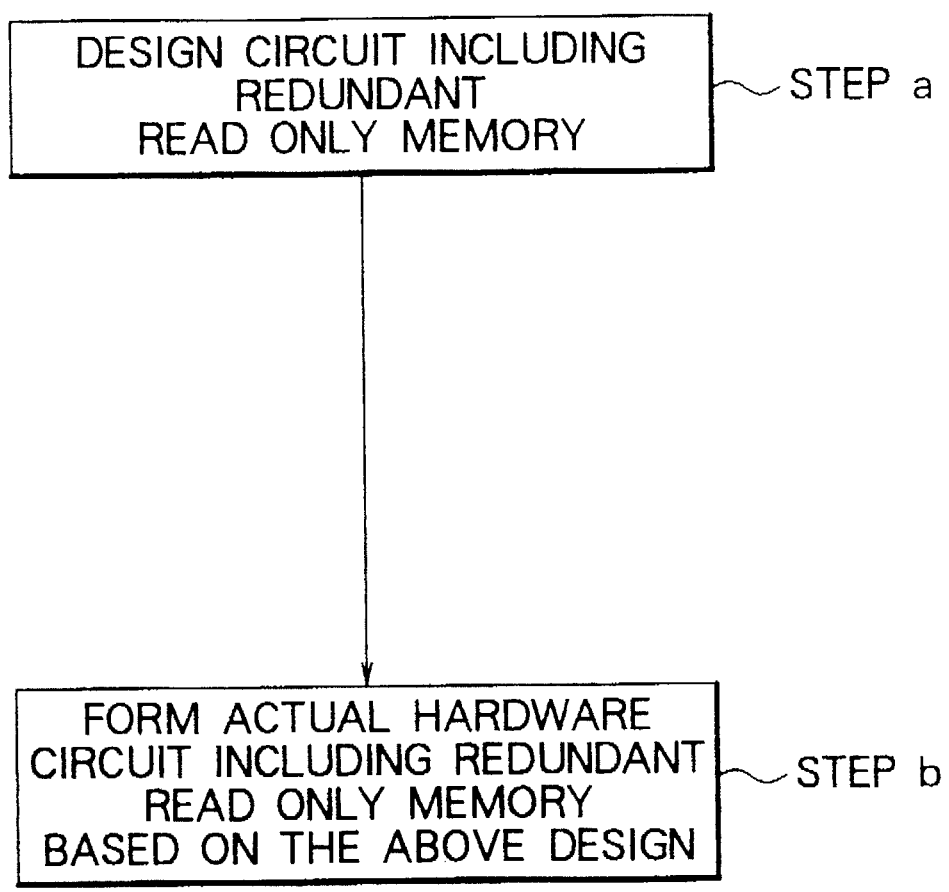
FIG. 4 is a view explaining the flow of design in the past.

By this, it is possible to realize hardware with a smaller size of circuitry than conventional hardware produced by the design process shown in FIG. 4.

As explained above, according to the present invention, a redundancy-free memory a smaller number of words in size can be constructed by making values the same in a redundancy-ridden memory values of a new single address.

Further, after designing a circuit including a redundancy-ridden memory, it is possible to improve it to a circuit using a redundancy-free memory without requiring advance change of the address designations. By making the hardware based on the improved circuit, it is possible to reduce the size of the circuit.

What is claimed is:

1. A memory circuit comprising:

a redundancy-free memory for restoring at a single address identical data found at a plurality of addresses; and an address conversion circuit for converting said plurality of addresses to said single address;

thereby reducing the size of the memory required to store the data while enabling retrieval of the data with no loss thereof.

2. A method of accessing a memory circuit comprising the steps of:

restoring at a single address identical data found at a plurality of addresses; and converting said plurality of addresses to said single address;

thereby reducing the size of the memory required to store the data while enabling retrieval of the data with no loss thereof.

3. A method of preparation of data of a memory comprising the steps of:

receiving as input the data of a first memory in which identical first data are stored at a plurality of addresses;

assigning to a single address of a second memory said identical first data; and outputting the data stored in said second memory;

thereby reducing the size of the memory required to store the data while enabling retrieval of the data with no loss thereof.

4. A memory circuit comprising:

a redundancy-free memory for storing at a single address identical data found at a plurality of addresses; and an address conversion circuit for converting said plurality of addresses to said single address;

wherein said address conversion circuit comprises:

a first logical decoder circuit for decoding three addresses into eight addresses;

a logical-OR circuit receiving said eight addresses and outputting four addresses; and a second logical decoder circuit for decoding said four addresses into two addresses, whereby said two addresses are used to access said redundancy-free memory.

5. A method of accessing a memory circuit comprising the steps of:

storing at a single address data of a plurality of addresses; and converting said plurality of addresses to said single address, whereby said data can be accessed;

further comprising the steps of:

decoding three addresses into eight addresses;

performing logical-OR operations for converting said eight addresses into four addresses; and decoding said four addresses into two addresses;

using said two addresses to access said data in said memory circuit.

6. A memory circuit comprising:

a redundancy-free memory for storing at a single address data to be read out by accessing a plurality of address; and a first logical decoder circuit for decoding three addresses into eight addresses;

a logical-OR circuit receiving said eight addresses and outputting four addresses;

a second logical decoder circuit for decoding said four addresses into two addresses, whereby said two addresses are used to access said redundancy-free memory.

7. A method of accessing a memory circuit comprising the steps of:

storing at a single address data of a plurality of addresses; and decoding three addresses into eight addresses;

performing logical-OR operations for converting said eight addresses into four addresses;

decoding said four addresses into two addresses;

using said two addresses to access said data in said memory circuit.

* * * * *